(12) United States Patent
Frohberg et al.

(10) Patent No.: US 8,361,844 B2
(45) Date of Patent: Jan. 29, 2013

(54) METHOD FOR ADJUSTING THE HEIGHT OF A GATE ELECTRODE IN A SEMICONDUCTOR DEVICE

(75) Inventors: Kai Frohberg, Niederau (DE); Heike Berthold, Hirschfeld (DE); Katrin Reiche, Goltzscha (DE); Uwe Griebenow, Markkleeberg (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 12/754,359

(22) Filed: Apr. 5, 2010

(65) Prior Publication Data

US 2010/0190309 A1    Jul. 29, 2010

Related U.S. Application Data

(62) Division of application No. 12/115,627, filed on May 6, 2008, now abandoned.

(30) Foreign Application Priority Data

Oct. 31, 2007    (DE) .................. 10 2007 052 167

(51) Int. Cl.
*H01L 21/335* (2006.01)
(52) U.S. Cl. ........................................ 438/142; 438/197
(58) Field of Classification Search .................. 438/142, 438/197
See application file for complete search history.

(56) References Cited

U.S. PATENT DOCUMENTS

| | | | | |
|---|---|---|---|---|
| 4,966,867 A * | 10/1990 | Crotti et al. | .................... | 438/701 |
| 5,185,279 A | 2/1993 | Ushiku | ........................... | 437/41 |
| 5,891,784 A | 4/1999 | Cheung et al. | ................. | 438/303 |
| 5,953,612 A * | 9/1999 | Lin et al. | ........................ | 438/299 |
| 6,924,518 B2 | 8/2005 | Iinuma et al. | .................. | 257/284 |
| 6,979,635 B1 | 12/2005 | Sultan et al. | ................... | 438/595 |
| 2001/0011756 A1 | 8/2001 | Yu | ................................... | 257/408 |
| 2005/0026379 A1* | 2/2005 | Kammler et al. | ............. | 438/303 |
| 2005/0048732 A1 | 3/2005 | Park et al. | ....................... | 438/305 |
| 2005/0218452 A1* | 10/2005 | Yamazaki et al. | ............ | 257/347 |
| 2006/0134916 A1 | 6/2006 | Prince et al. | ................... | 438/692 |
| 2007/0122957 A1 | 5/2007 | Anderson et al. | ............. | 438/197 |
| 2007/0148966 A1* | 6/2007 | Baks et al. | ...................... | 438/638 |
| 2007/0290278 A1 | 12/2007 | Kook et al. | .................... | 257/410 |

FOREIGN PATENT DOCUMENTS

| | | |
|---|---|---|
| DE | 199 09 815 B4 | 9/2005 |
| JP | 02162738 | 6/1990 |
| JP | 04053234 | 2/1992 |

OTHER PUBLICATIONS

PCT Search Report and Written Opinion from PCT/US2008/012188 dated Feb. 6, 2009.
Translation of Official Communication from German Patent Office for German Patent Application No. 10 2007 052 167.9 dated May 9, 2008.

* cited by examiner

*Primary Examiner* — Jae Lee
(74) *Attorney, Agent, or Firm* — Williams, Morgan & Amerson, P.C.

(57) ABSTRACT

By providing an implantation blocking material on the gate electrode structures of advanced semiconductor devices during high energy implantation processes, the required shielding effect with respect to the channel regions of the transistors may be accomplished. In a later manufacturing stage, the implantation blocking portion may be removed to reduce the gate electrode height to a desired level in order to enhance the process conditions during the deposition of an interlayer dielectric material, thereby significantly reducing the risk of creating irregularities, such as voids, in the interlayer dielectric material, even in densely packed device regions.

20 Claims, 11 Drawing Sheets

METHOD FOR ADJUSTING THE HEIGHT OF A GATE ELECTRODE IN A SEMICONDUCTOR DEVICE

CROSS-REFERENCE TO THE RELATED APPLICATION

This is a divisional of application Ser. No. 12/115,627, filed May 6, 2008 now abandoned.

BACKGROUND OF THE INVENTION

1. Field of the Invention

Generally, the present disclosure relates to the formation of integrated circuits, and, more particularly, to the formation of a dielectric interlayer between and over circuit elements including closely spaced lines, such as gate electrodes, polysilicon interconnect lines and the like.

2. Description of the Related Art

During the fabrication of integrated circuits, a large number of circuit elements are formed on a given chip area according to a specified circuit layout. Generally, a plurality of process technologies are currently practiced, wherein, for complex circuitry, such as microprocessors, storage chips and the like, MOS technology based on silicon is currently the most promising approach due to the superior characteristics in view of operating speed and/or power consumption and/or cost effectiveness. During the fabrication of complex integrated circuits using MOS technology, millions of transistors, i.e., N-channel transistors and/or P-channel transistors, are formed on a substrate including a crystalline semiconductor layer, such as a silicon-based layer. A MOS transistor, irrespective of whether an N-channel transistor or a P-channel transistor is considered, comprises so-called PN junctions that are formed by an interface of highly doped drain and source regions with a lightly doped channel region disposed between the drain region and the source region. The conductivity of the channel region, i.e., the drive current capability of the conductive channel, is controlled by a gate electrode that comprises a line-like portion and is formed above the channel region and separated therefrom by a thin insulating layer.

Typically, the circuit elements, such as the MOS transistors, capacitors, resistors and the like, are formed in a common layer, which will be referred to hereinafter as a device layer, whereas the "wiring," i.e., the electrical connection of circuit elements according to the circuit design, may be accomplished only to a certain degree by means of polysilicon lines and the like within the device layer so that one or more additional "wiring" layers formed over the device layer may be required. These wiring layers include metal lines embedded into an appropriate dielectric material, such as silicon dioxide, silicon nitride and the like, or, in advanced devices, low-k materials having a permittivity of 3.0 or less are used. The metal lines and the surrounding dielectric material will be referred to hereinafter as a metallization layer. Between two stacked adjacent metallization layers and also between the device layer and the first metallization layer, respective dielectric interlayers are formed through which metal-filled openings are formed to establish the electrical connection between metal lines or between circuit elements and metal lines. In typical applications, the dielectric interlayer separating the device layer from the first metallization layer is essentially formed from silicon dioxide that is deposited above a dielectric etch stop layer by well-established plasma enhanced chemical vapor deposition (PECVD) techniques, which enable the formation of a smooth and dense silicon dioxide film with sufficient conformality at moderately high deposition rates. Due to the continuous device scaling resulting in gate lengths of MOS transistors on the order of 50 nm or less, the distances between neighboring circuit elements, such as polysilicon lines, gate electrodes and the like, are also reduced and have now reached, in modern CPUs, approximately 200 nm and less, which translates into approximately 100 nm or less for the space width between the densely packed polysilicon lines. It turns out, however, that the gap-fill capabilities of well-established high rate PECVD techniques for the deposition of silicon nitride, which is frequently used as material for the etch stop layer, and silicon dioxide, which is often used as interlayer dielectric, may no longer suffice to reliably form a dielectric interlayer, as will be described in more detail with reference to FIGS. 1a-1b.

FIG. 1a schematically illustrates a cross-sectional view of a semiconductor device comprising a plurality of transistor elements wherein, for convenience, only two transistor elements 150A, 150B are shown. The transistors 150A, 150B may be formed in and above a semiconductor layer 102, for instance a silicon-containing semiconductor material, or any other appropriate material for forming therein appropriately shaped dopant profiles as may be required for sophisticated transistor elements and other circuit features, such as capacitors and the like. The semiconductor layer 102 is formed above a substrate 101 which may represent a semiconductor material, such as a silicon material and the like. The semiconductor layer 102 and the substrate 101 may represent a "bulk" configuration in which the substrate 101 may be comprised of substantially the same crystalline material as the semiconductor layer 102. In other cases, the substrate 101 and the semiconductor layer 102 may represent a silicon-on-insulator (SOI) configuration, wherein at least a portion of the substrate 101 may comprise an insulating material, such as a silicon dioxide material, on which is formed the semiconductor layer 102. Moreover, in the manufacturing stage shown, the transistors 150A, 150B may each comprise a gate electrode structure 152 comprised of an electrode portion 153, which may be comprised of a suitable electrode material, such as polysilicon. Furthermore, the gate electrode structures 152 may comprise a gate insulation layer 154 including any appropriate material composition, such as silicon dioxide, silicon nitride, high-k dielectric materials in sophisticated applications and the like. Furthermore, a sidewall spacer structure 156 may be provided on sidewalls of the gate electrode structure 152, wherein the spacer structure 156 may comprise two or more individual spacer elements, possibly in combination with respective etch stop materials, as is well known in the art. Furthermore, respective drain and source regions 151 are provided in the semiconductor layer 102 with a suitable vertical and lateral profile for obtaining the desired transistor characteristics.

The semiconductor device 100 as shown in FIG. 1a may be formed on the basis of well-established conventional process strategies, which may include the following processes. After forming appropriate isolation structures (not shown), which may define respective active regions in the semiconductor layer 102 to form therein circuit elements, such as the transistors 150A, 150B, the gate insulation layer 154 may be formed, for instance, by oxidation and/or deposition techniques, in order to obtain a desired thickness and material composition. Thereafter, a gate electrode material, such as polysilicon, may be deposited, for instance, by low pressure chemical vapor deposition (LPCVD) techniques, wherein a thickness of the polysilicon material may be selected in accordance with process requirements for the device 100. That is, in sophisticated applications, a thickness of the polysilicon material, which may thus determine the finally obtained height 152H of the gate electrode structure 152, may be selected such that, on the one hand, the functionality of the gate electrode structure 152 may be achieved and, on the other hand, in view of acting as an efficient implantation mask during the definition of the drain and source regions 151, a sufficient shielding effect is achieved to suppress the introduction of dopants in a channel region 155. Thus, after the deposition of the electrode material with the required thickness 152H, sophisticated lithography and patterning process are performed in order to define the lateral size of the gate electrode structure 152. Thereafter, a first portion of the drain and source regions 151 may be formed, for instance, on the basis of a respective offset spacer (not shown) by ion implantation, wherein, typically, a shallow dopant profile is to be established while using the gate electrode structure 152, possibly in combination with any offset spacers, as an efficient implantation mask. Next, the spacer structure 156 may be formed using well-established deposition and etch techniques to obtain the desired lateral shielding effect of the gate electrode structure 152 in combination with the spacer structure 156. Thereafter, an implantation process 103 is performed with appropriately selected process parameters, such as implantation energy and dose, to position a required dopant concentration at a desired depth within the semiconductor layer 102, while the spacer structure 156 defines a lateral profile of the dopant concentration. Furthermore, during the implantation process 103, penetration of dopant species into the channel region 155, which is substantially positioned below the gate electrode structure 152, may have to be avoided since any additional dopant species positioned therein may significantly alter the finally obtained transistor characteristics, for instance, in terms of threshold voltage, control of short channel effects and the like. Thus, the height 152H and the gate electrode structure 152 is selected such that the implantation blocking capability of the polysilicon portion 153 is sufficient to substantially avoid the penetration of the gate insulation layer 154 and the underlying channel region 155. After the implantation process 103, an appropriately designed anneal process may be performed in order to activate the dopants in the drain and source regions 151 and also re-crystallize implantation-induced damage in the semiconductor layer 102.

FIG. 1*b* schematically illustrates the semiconductor device 100 in a further advanced manufacturing stage, in which metal silicide regions 157 may be formed in the drain and source regions 151 and also in the polysilicon electrode portions 153. Additionally, a first portion of an interlayer dielectric material, for instance, in the form of a silicon nitride layer 104, is provided above the first and second transistors 150A, 150B. As previously explained, in advanced semiconductor devices, a spacing 105 between closely spaced circuit elements, such as the transistors 150A, 150B may be reduced with the advance to a new technology standard, which may thus require enhanced gap-filling capabilities of deposition processes for forming an interlayer dielectric material, such as the silicon nitride layer 104. Consequently, after the forming of the metal silicide regions 157, which may be accomplished on the basis of well-established techniques, typically a PECVD process is performed to deposit the silicon nitride material 104, wherein, however, the moderately high aspect ratio defined by the distance 105 and the height 152H of the gate electrode structure 152 may result in irregularities, for instance, in the form of voids 104A, which may be caused by the non-sufficient conformal deposition capabilities of the respective PECVD process. The irregularities 104A may thus result in process non-uniformities during the further deposition of a further interlayer dielectric material, such as a silicon dioxide material, and may also result in contact failures, when forming respective openings for contacts in order to connect the transistors 150A, 150B with a metallization level to be formed above the transistors 150A, 150B. Since the layer 104 may be used as an etch stop layer and, in sophisticated applications, may also be used as a strain-inducing source as silicon nitride may be deposited with high internal compressive and tensile strain, an arbitrary reduction of the layer thickness of the layer 104 in view of enhancing the conformal deposition behavior may be less than desirable.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein provides a technique and respective semiconductor devices in which the deposition of an interlayer dielectric material may be accomplished on the basis of less critical aspect ratios, even in densely packed device areas, by reducing the height of gate electrode structures prior to the deposition of the interlayer dielectric material. On the other hand, the required implantation blocking capabilities of the gate electrode structures may be maintained until any high energy implantation processes have been completed by providing the gate electrode structures with an appropriate initial height, which may then be reduced on the basis of appropriate process techniques. Consequently, enhanced process uniformity may be obtained during the deposition of an interlayer dielectric material, while concurrently the required implantation blocking effect during the definition of deep drain and source regions may still be maintained.

One illustrative method disclosed herein comprises forming a gate electrode structure of a transistor above a semiconductor layer, wherein the gate electrode structure comprises an electrode portion formed on a gate insulation layer and an implantation blocking portion formed on the electrode portion. The method further comprises forming drain and source regions in the semiconductor layer by ion implantation using the gate electrode structure as an implantation mask to substantially prevent penetration of ions into a channel region of the transistor through the gate electrode structure. Additionally, the method comprises removing at least the implantation blocking portion to expose the electrode portion and forming an interlayer dielectric material adjacent and above the electrode portion.

A further illustrative method disclosed herein comprises forming a plurality of gate electrode structures above a semiconductor layer, wherein each of the plurality of gate electrode structures has an initial height. The method further comprises forming drain and source regions in the semiconductor layer by ion implantation using the plurality of gate electrode structures as an implantation mask, wherein the initial height is selected in such a manner that penetration of ions into the semiconductor layer is substantially prevented. Moreover, the method comprises reducing the initial height of the plurality of gate electrode structures to obtain a reduced height and forming an interlayer dielectric material adjacent to and above the plurality of gate electrode structures on the basis of the reduced height.

One illustrative semiconductor device disclosed herein comprises a gate electrode structure formed above a semiconductor layer, wherein the gate electrode structure comprises a gate insulation layer and an electrode portion formed on the gate insulation layer. The electrode portion has a height corresponding to a first amount. Furthermore, the semiconductor device comprises drain and source regions formed in the semiconductor layer and extending in a depth direction according to a second amount, wherein the drain and source regions have a top surface at a height level that is substantially defined by the gate insulation layer, and wherein the first amount is less than the second amount.

BRIEF DESCRIPTION OF THE DRAWINGS

The disclosure may be understood by reference to the following description taken in conjunction with the accompanying drawings, in which like reference numerals identify like elements, and in which.

Figure 1A:
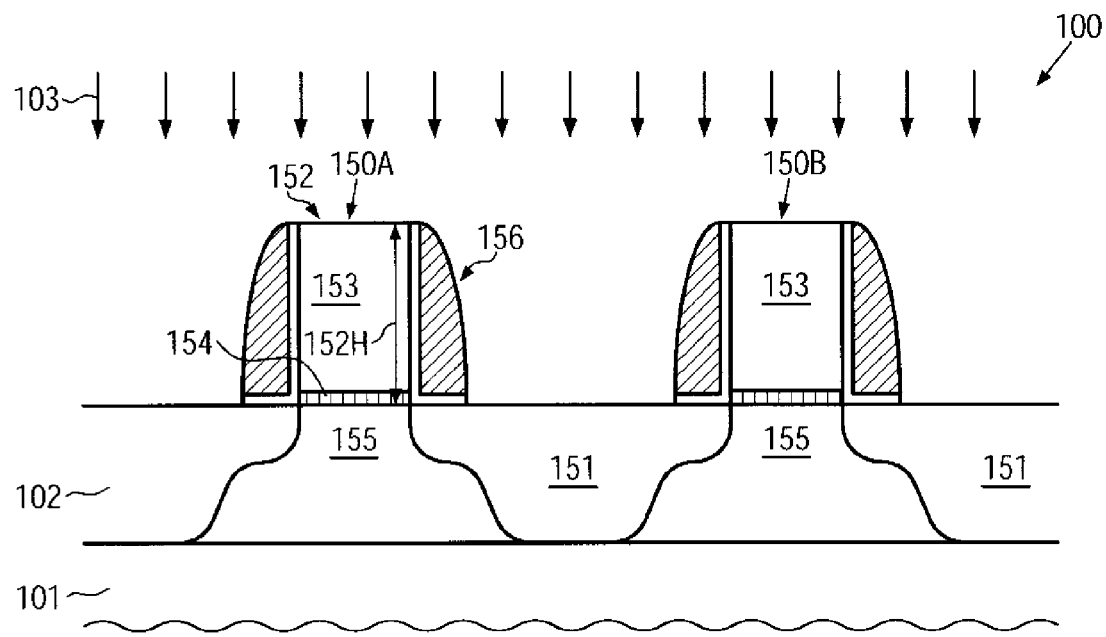
FIGS. 1a-1b schematically illustrate cross-sectional views of a semiconductor device including densely packed transistor elements formed according to conventional device strategies, which may result in irregularities in an interlayer dielectric material.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides techniques and respective semiconductor devices in which the pronounced surface topography, in particular in densely packed device areas of advanced semiconductor devices, may be reduced after the definition of deep drain and source regions by reducing the height of gate electrode structures to reduce the probability for creating irregularities, such as voids, upon depositing an appropriate interlayer dielectric material. That is, a gate electrode structure may initially be provided with an appropriate height to comply with the requirements of high energy implantation processes, after which the electrode height may be reduced to a level that is appropriate for a highly conformal deposition result of an interlayer dielectric material, such as an etch stop material, which may frequently be provided in a highly stressed configuration in order to enhance charge carrier mobility in channel regions of the devices. In some illustrative aspects disclosed herein, the initial height of the gate electrode structures may be obtained by providing an electrode portion having a height or thickness that corresponds to a final gate height so as to conform with the gap-filling capabilities during the deposition of the interlayer dielectric material, while the implantation blocking characteristics may be obtained, in combination with the electrode portion, by a further portion, also referred to as an implantation blocking portion, which may be comprised of any appropriate material that is compatible with the further processing of the gate electrode structures until removal of the implantation blocking portion. In other illustrative embodiments disclosed herein, the gate electrode material may be provided with a suitable initial height for efficiently blocking the penetration of high energetic ions and an appropriate reduction of the initial height may be performed in a later stage, thereby efficiently reducing the surface topography for the subsequent deposition of the interlayer dielectric material. In still other illustrative embodiments, an intermediate material layer may be provided in the gate electrode structure which may be used as an etch stop or chemical mechanical polishing (CMP) stop layer during the height reduction, wherein process uniformity during the patterning of the gate electrode structure may also be enhanced on the basis of the intermediate layer.

Thus, the principles disclosed herein may be advantageously applied to sophisticated semiconductor devices including densely packed circuit elements, such as gate electrode structures, wherein the gap-filling capabilities of well-established deposition techniques, for instance with respect to highly stressed material, may be "extended" due to a reduction of the effective aspect ratio. Hence, these well-established and efficient process techniques may be used for future device generations while nevertheless preserving a high degree of compatibility with process techniques for forming deep drain and source regions. For example, the techniques disclosed herein are highly advantageous in the context of semiconductor devices including gate electrode structures having a gate length of 50 nm and less, since, in this case, the spacing between adjacent conductive lines and gate electrode structures in densely packed device areas may be 100 nm and less.

Figure 2A:
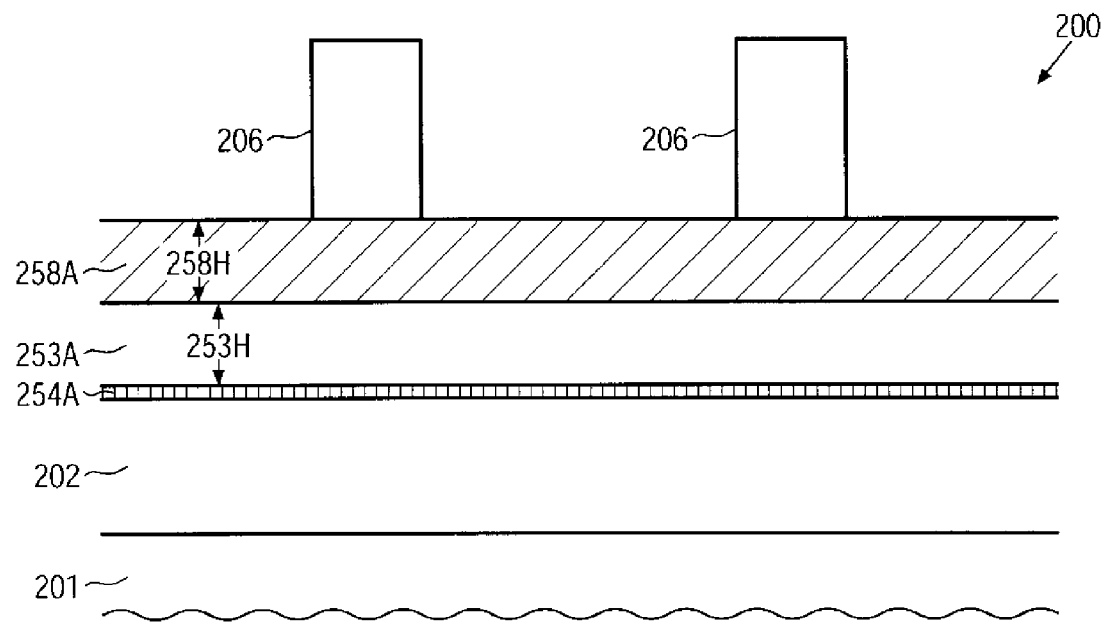
FIGS. 2a-2h schematically illustrate cross-sectional views of a semiconductor device during various manufacturing stages, wherein the height of a gate electrode is initially defined by an implantation blocking portion and an electrode portion to provide the desired implantation blocking capabilities, with a subsequent reduction of the initial height, according to illustrative embodiments.

FIG. 2a schematically illustrates a cross-sectional view of a semiconductor device 200 at an early manufacturing stage. The semiconductor device 200 may comprise a substrate 201, which may represent an appropriate carrier material for forming thereabove a semiconductor layer 202, such as a silicon layer, a silicon/germanium layer or any other appropriate semiconductor material, which may comprise a plurality of different components. Furthermore, the substrate 201, in combination with the semiconductor layer 202, may represent a bulk configuration or an SOI configuration, as previously explained with reference to the device 100, while, in other cases, in certain device areas, a bulk configuration may be provided, while, in other device areas, an SOI-like configuration may be used to individually enhance performance of the various regions of the device 200. Furthermore, the semiconductor device 200 may comprise an insulating layer 254A, which may be used as a gate insulation layer in a later stage, at least in some device areas. Furthermore, a gate electrode material 253A may be provided, such as polysilicon material, which may be provided in a pre-doped form, depending on the device requirements. The gate electrode material 253A may have a thickness 253H that, in some illustrative embodiments, may substantially correspond to a desired final height of a gate electrode structure still to be formed. That is, the height 253H may represent a height which, in combination with a minimum distance between closely spaced circuit elements, may define an aspect ratio that is appropriate with respect to the gap-filling capabilities of a deposition process for forming an interlayer dielectric material. For instance, in some illustrative embodiments, the semiconductor layer 202 may be formed on a buried insulating layer (not shown) to provide an SOI-like configuration, wherein a thickness of the semiconductor layer 202 may be greater than the height 253H, contrary to conventional strategies, in which the implantation blocking capabilities of a gate electrode structure may require a larger height compared to the thickness of an active silicon layer in an SOI device, when the drain and source regions have to extend down to the buried insulating layer.

Furthermore, in the manufacturing stage shown, the device 200 may comprise an implantation blocking material 258A, which may be provided in the form of any appropriate material, such as silicon dioxide, silicon nitride, silicon oxynitride or any other appropriate material composition that may be compatible with the further processing, for instance, with respect to high temperature processes and the like. A height 258H of the implantation blocking material 258A may be selected on the basis of the respective maximum implantation energies occurring during the further manufacturing processes and also on the basis of the stopping capabilities of the material 258A. For example, if a moderately dense silicon nitride material may be used for the layer 258A, the overall height, that is, the sum of the heights 258H and 253H may be less compared to a corresponding initial height that would be required in conventional devices, due to the increased ion blocking capabilities of the silicon nitride material. It should be appreciated that an appropriate thickness for the layer 258A may be readily determined on the basis of experimental data and/or simulations by taking into consideration the required implant energies and implant species. Thus, for a desired final height 253H, the height 258H may be appropriately selected to avoid undue penetration of the layer 254A and the semiconductor material 202 by a dopant species in a later manufacturing stage.

Furthermore, as shown, the semiconductor device 200 may comprise an etch mask 206, such as a resist mask having lateral dimensions appropriate for defining gate electrode structures on the basis of the layers 258A and 253A.

The semiconductor device 200 as shown in FIG. 2a may be formed on the basis of the following processes. After forming respective isolation structures (not shown), the insulating layer 254A may be formed by oxidation and/or deposition and/or other surface treatments, followed by the deposition of the electrode material 253A with the target height 253H. Next, the material 258A may be formed by depositing one or more appropriate materials with the predetermined target height 258H wherein, as previously discussed, even a reduced height compared to conventional strategies may be obtained when the layer 258A provides increased ion blocking capabilities compared to the electrode material 253A, which may be provided in the form of polysilicon. Thereafter, the etch mask 206 may be formed on the basis of sophisticated lithography techniques and an etch process may be performed to pattern the layers 258A and 253A on the basis of the mask 206. In some illustrative embodiments, the respective patterning process may comprise a first etch process to transfer the mask pattern of the mask 206 into the layer 258A, while using the material 253A as an efficient etch stop with a subsequent further etch for patterning the material 253A on the basis of well-established recipes, wherein the previously patterned layer 258A may act as an efficient etch mask. Thus, at least during the patterning of the layer 253A, a high degree of compatibility with conventional techniques may be maintained, since similar etch recipes may be used, while additionally the patterned material 258A may be used as an efficient hard mask, thereby enhancing the overall process uniformity, since a reduced thickness may have to be etched during each individual etch step.

Figure 2B:
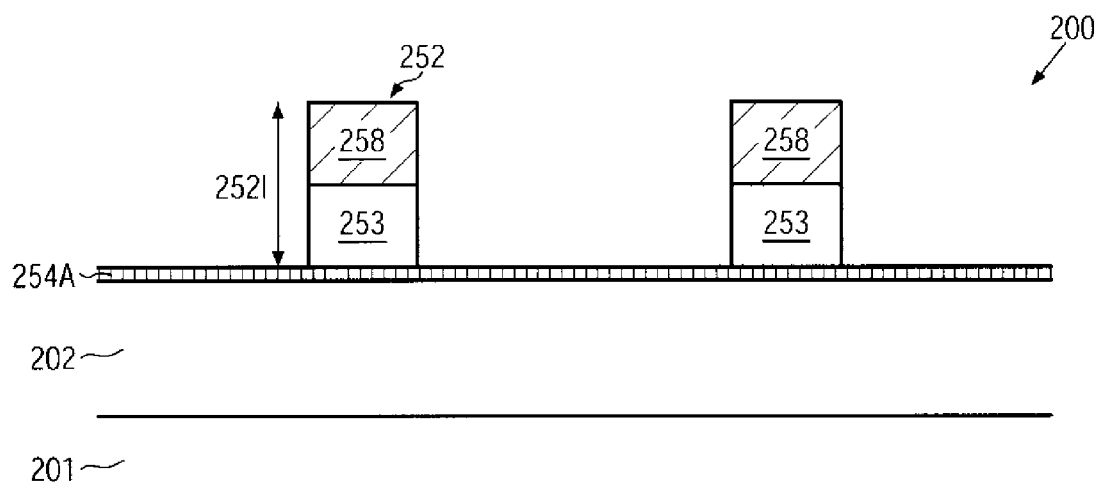

FIG. 2b schematically illustrates the semiconductor device 200 after the above-described process sequence. Hence, gate electrode structures 252 are provided, each of which includes an electrode portion 253 and an implantation blocking portion 258, which commonly define an initial height 252I.

Figure 2C:
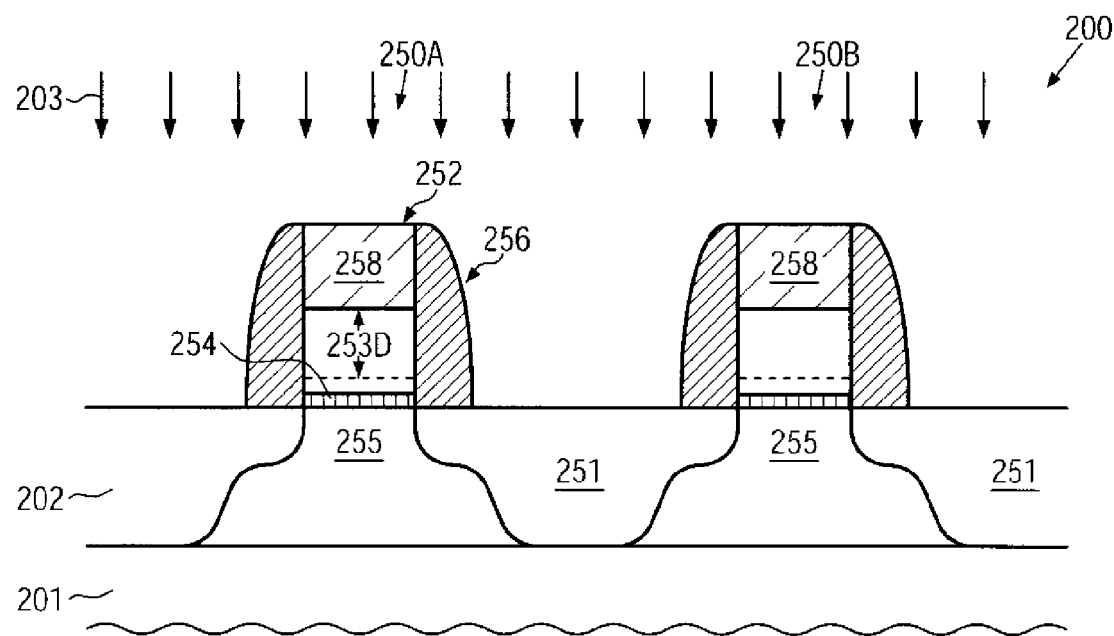

FIG. 2c schematically illustrates the semiconductor device 200 in a further advanced manufacturing stage. As shown, transistor elements 250A, 250B may comprise the gate electrode structures 252 including gate insulation layers 254, wherein a sidewall spacer structure 256 may be provided to define the lateral offset of deep drain and source regions 251, which may be formed during an ion implantation process 203. During the implantation process 203, the gate electrode structures 252 may efficiently block incident ions so as to substantially avoid the penetration of channel regions 255 by the dopants used during the implantation process 203, wherein the initial height 252I may be selected to allow the deposition of dopant material down to a specified thickness 253D. That is, in some illustrative embodiments, the height 253H may be selected to conform with requirements of a deposition process for interlayer dielectric material, as discussed above, while the thickness 258H, in combination with the type of material used for the portion 258, may be selected such that a desired penetration depth 253D may be obtained in the electrode portion 253. In other illustrative embodiments, the penetration depth 253D during the implantation process 203 may be less critical as long as damage of the insulation layer 254 and dopant incorporation in the channel region 255 may be substantially avoided.

In case that an increased dopant concentration may be required in the electrode portion 253, an additional implantation process with reduced energy may be performed in a later stage after the removal of the portion 258, or at least a portion thereof, when an additional implantation for the electrode portion 253 is considered appropriate. After the implantation process 203, an anneal process may be performed to activate the dopants in the drain and source regions 251 and also re-crystallize implantation-induced damage. In other illustrative embodiments, the anneal process may be performed at a later stage, i.e., after removing the implantation blocking portion 258.

Figure 2D:
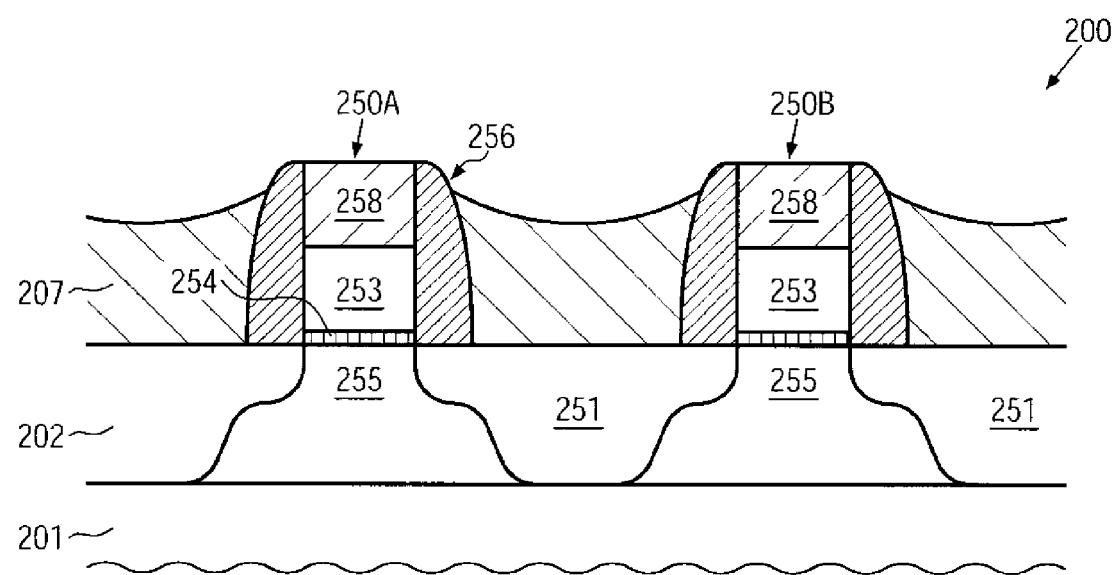

FIG. 2d schematically illustrates the semiconductor device 200 with a planarization material 207, which may be provided on the basis of any appropriate organic material, such as polymer materials, resist materials and the like. In this case, the planarization material 207 may be deposited in a highly non-conformal state, for instance, by spin-coating in a low viscous state followed by an appropriate treatment, such as heat treatment, radiation treatment and the like, for hardening the material 207. Consequently, the planarization material 207 may fill, at least up to a substantial portion of the height of the transistors 250A, 250B, i.e., to the initial height 252I (FIG. 2b), any gaps between the densely packed transistors 250A, 250B.

Figure 2E:
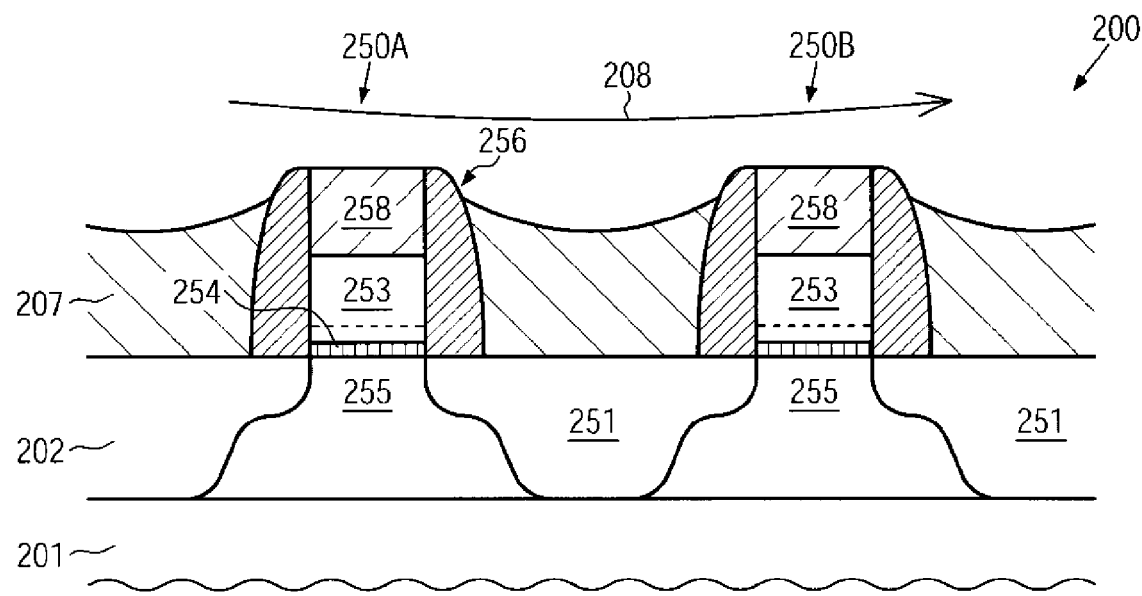

FIG. 2e schematically illustrates the semiconductor device 200 during a material removal process 208, which, in one illustrative embodiment, may comprise a chemical mechanical polishing (CMP) process, in which the planarization material 207 may provide for integrity of other device areas, such as the spaces between the transistors 250A, 250B. During the removal process 208, when performed as a CMP process, the surface portions are brought into contact with a slurry and a polishing pad (not shown), wherein process parameters may be adjusted such that a desired removal rate may be established. The removal rate may be different for the different materials exposed to the slurry and the polishing pad, depending on the process parameters of the CMP process, such as the chemical composition of the slurry, the relative speed of the polishing pad with respect to the substrate, the down force and the like. For example, the slurry and the process parameters may be selected to obtain a desired removal rate for the material of the portion 258 and the spacer structure 256, which may be comprised of similar materials, while the effective removal rate of the planarization material is less critical. Thus, during the removal process, the sidewall spacer structures 256 may also be reduced in height, thereby resulting in a substantially planar surface topography. The removal process 208 may be controlled by respective endpoint detection signals, as may typically be available in sophisticated CMP techniques, since the optical and/or mechanical response to the polishing activity may change upon exposing the electrode portions 253. In other illustrative embodiments, the removal process 208 may comprise an additional etch process for removing residues of the implantation blocking portion 258 after a significant amount thereof has been removed by CMP. In other illustrative embodiments, the removal may be accomplished by etching or a combination of an initial etching and a subsequent CMP, as will be described later on in more detail.

Figure 2F:
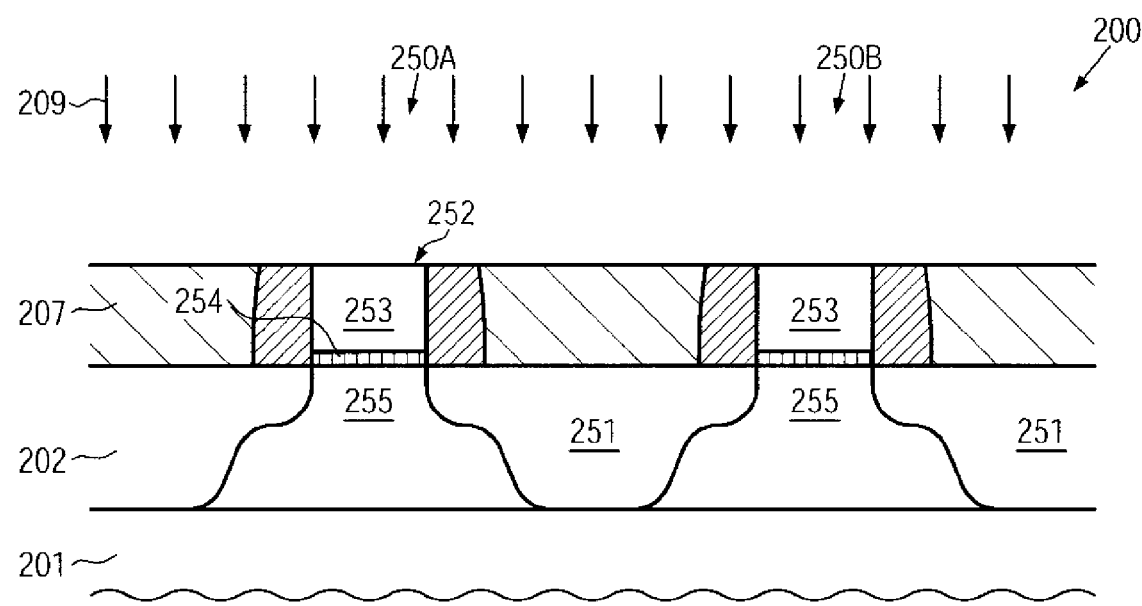

FIG. 2f schematically illustrates the semiconductor device 200 after the removal process 208 thereby exposing the electrode portions 253 and also obtaining a substantially planar surface topography. Furthermore, the semiconductor device 200 may be exposed to an etch ambient 209 for removing the residual planarization material 207, which may be accomplished on the basis of well-established plasma assisted etch processes, without unduly damaging the exposed electrode portions 253. In other illustrative embodiments, prior to the removal of the planarization material 207, a further implantation process may be performed to appropriately position a dopant species in the exposed electrode portions 253 if a further enhanced dopant concentration is considered appropriate in the gate electrode structures 252. Performing a corresponding implantation process prior to the removal of the planarization material 207 may result in a high integrity of the drain and source regions when an additional dopant concentration may not be desired. In other cases, a respective implantation process, if required, may be performed after the removal of the material 207, since typically the height of the electrode portions 253, and thus the implantation energy used, may be less than a maximum extension of the drain and source regions 251, thereby positioning a respective additional dopant concentration having a penetration depth corresponding to the height of the electrode portions 253 within the previously defined drain and source regions 251.

Figure 2G:
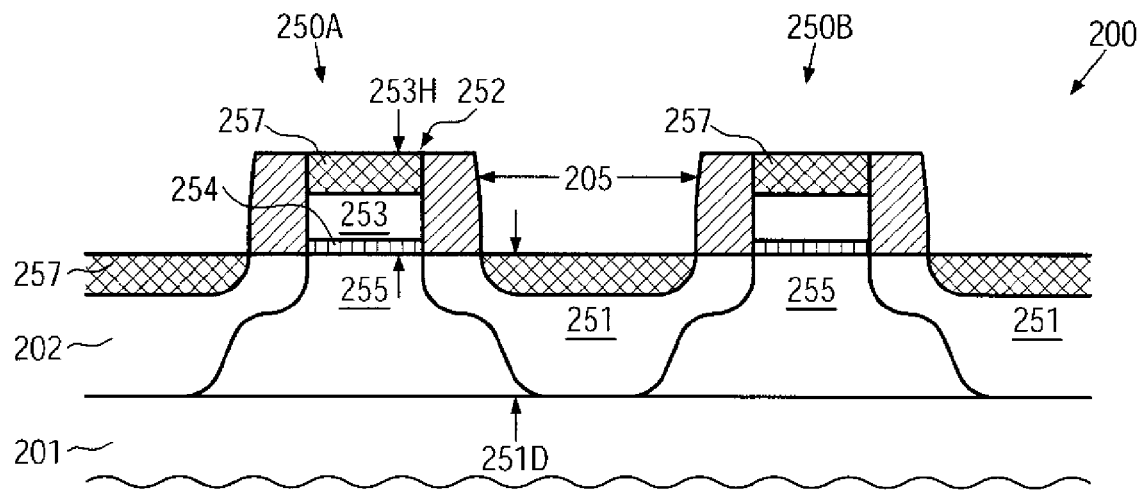

FIG. 2g schematically illustrates the semiconductor device 200 in a further advanced manufacturing stage. As shown, metal silicide regions 257 may be formed in the drain and source regions 251 and in the gate electrode structures 252, which are now substantially comprised of the electrode portions 253. The metal silicide regions 257 may be formed on the basis of well-established techniques after the removal of the planarization material 207 and respective cleaning processes. Furthermore, prior to the formation of the metal silicide regions 257, respective annealing processes may be performed, wherein, as previously discussed, optionally a low energy implantation process may have been performed. The semiconductor 200 as shown in FIG. 2g may, in some illustrative embodiments, comprise the gate electrode structures 252 with the final height that substantially corresponds to the height 253H, except for a respective modification of volume during the silicidation process. Similarly, the drain and source regions 251 may extend from a height level that is substantially defined by the gate insulation layer 254 into the depth of the semiconductor layer 202 according to an amount 251D, which may be greater than the amount of the height 253H. Thus, an aspect ratio defined by the height 253H and a distance 205 between the transistors 250A, 250B may be less critical for the subsequent deposition of an interlayer dielectric material, as discussed above.

Figure 1B:
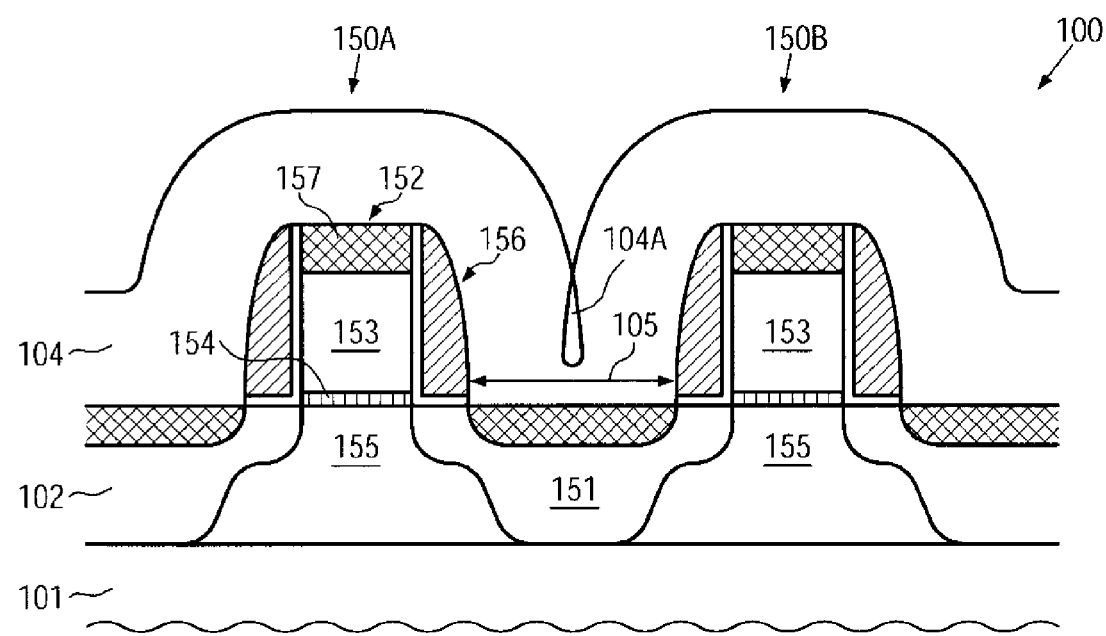
Figure 2H:
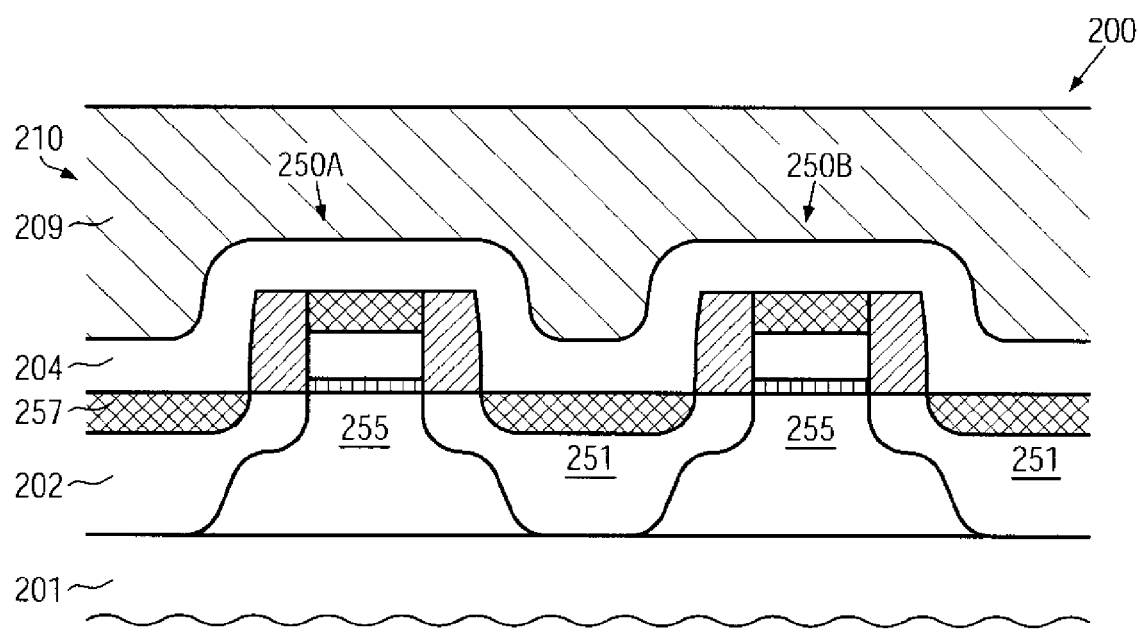

FIG. 2h schematically illustrates the semiconductor device 200 in a further advanced manufacturing stage. In the embodiment shown, the device may comprise an interlayer dielectric material 210, which may include an etch stop layer 204, for instance comprised of silicon nitride, silicon carbide, nitrogen-containing silicon carbide and the like. As previously explained, in some cases, the layer 204, which may also act as an etch stop layer, may exhibit a high internal stress level in order to enhance performance of the transistors 250A, 250B. Furthermore, the dielectric material 210 may comprise a dielectric material 209, such as silicon dioxide and the like. Due to the reduced aspect ratio, the deposition of the layers 204 and 209 may be performed on the basis of less critical surface conditions, thereby reducing the probability of creating irregularities, such as the voids 104A (FIG. 1b), and enabling a high degree of flexibility in providing an appropriate interlayer dielectric material, for instance in a highly stressed state, above respective transistors, such as the transistors 250A, 250B, even if positioned in densely packed device areas.

Figure 2I:
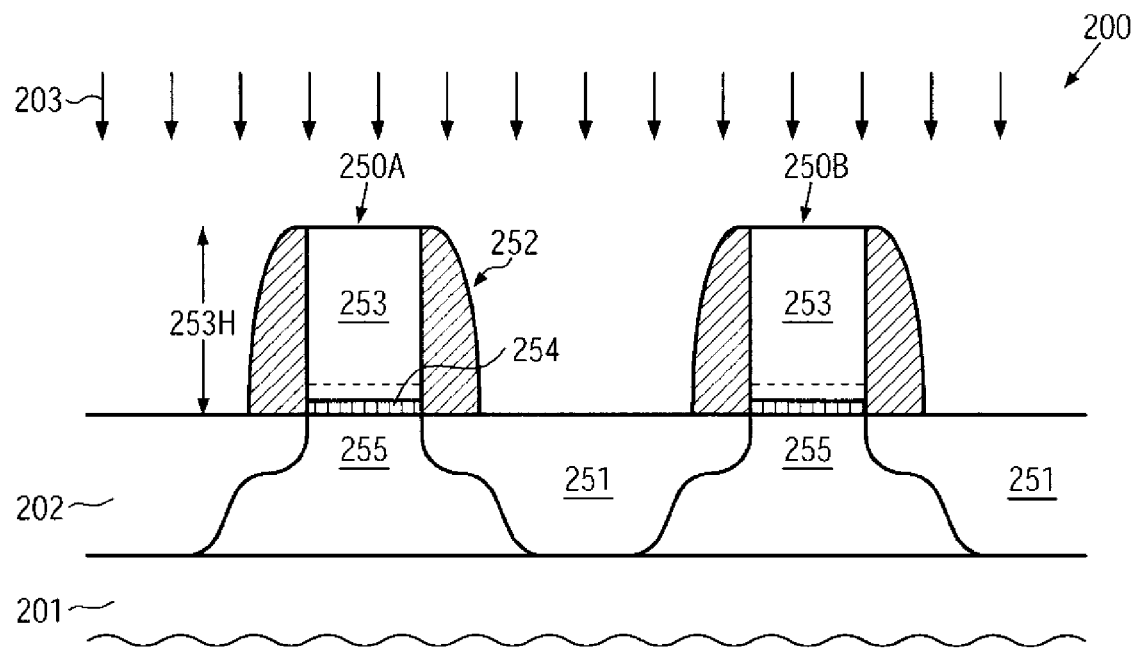
FIGS. 2i-2k schematically illustrate cross-sectional views of a semiconductor device according to further illustrative embodiments in which the height of gate electrode material may be selected in accordance with the implantation blocking capabilities and may be subsequently reduced to provide an appropriate aspect ratio during the formation of an interlayer dielectric material.

FIG. 2i schematically illustrates the semiconductor device 200 according to further illustrative embodiments, wherein the gate electrode structures 252 may comprise the electrode portion 253 with a height 253H that provides the desired ion blocking capabilities during the implantation process 203. That is, the electrode portion 253 may be provided on the basis of well-established conventional strategies, thereby providing a high degree of compatibility during the patterning of the gate electrode structures 252 with respect to conventional techniques.

Figure 2J:
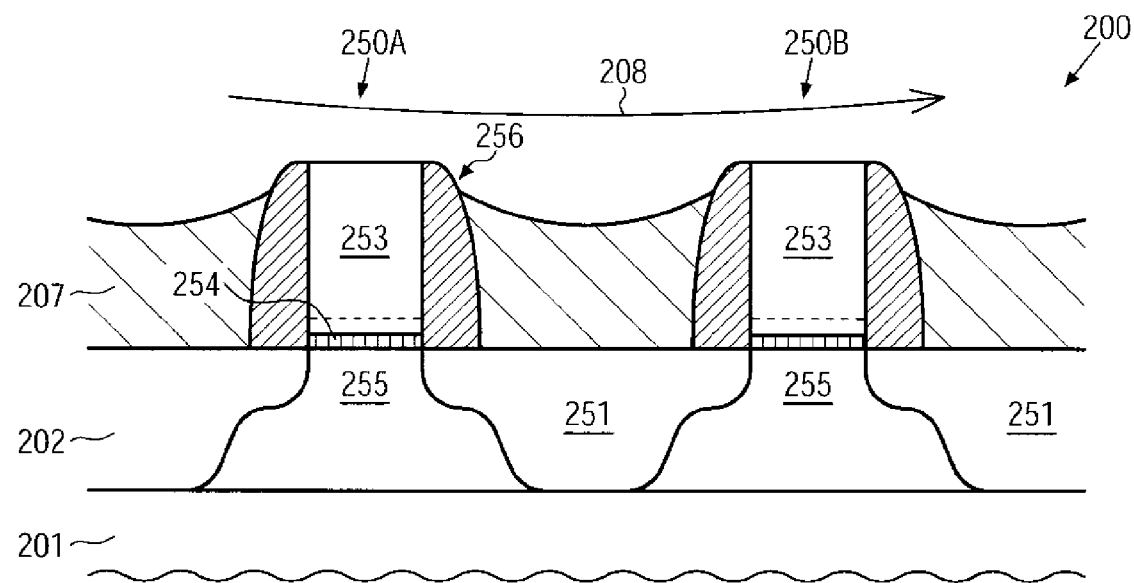

FIG. 2j schematically illustrates the semiconductor device 200 in a further advanced manufacturing stage, in which the planarization material 207 may be provided and the device 200 may be subjected to the removal process 208, as previously described. The removal process 208 may be performed as a time-controlled process, thereby enabling the removal of a desired portion of the gate electrode portion 253, so as to appropriately reduce the aspect ratio, as previously discussed.

Figure 2K:
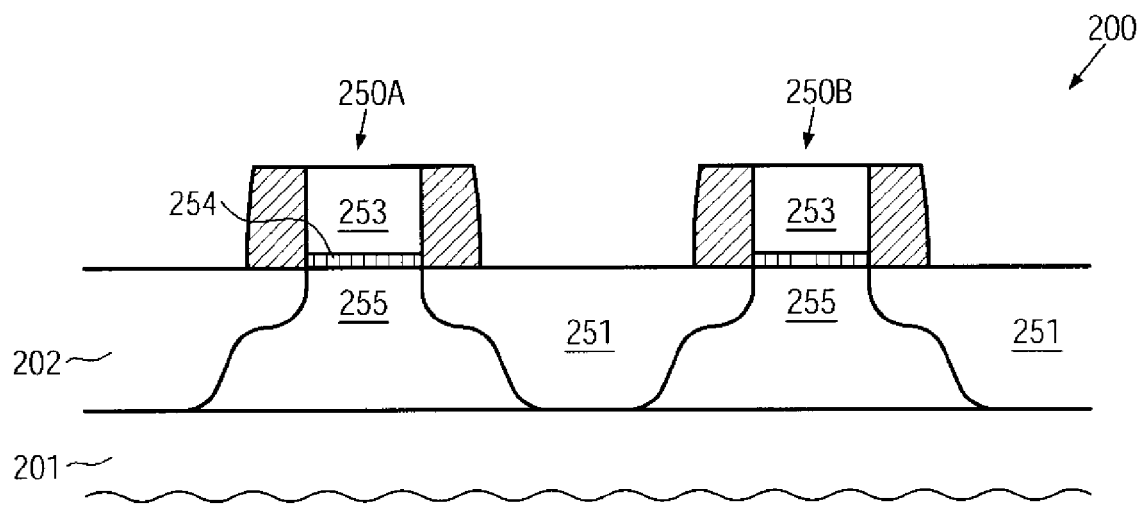

FIG. 2k schematically illustrates the semiconductor device 200 after the removal process 208 and the removal of the planarization material 207. The further processing may then be continued, for instance, by forming the metal silicide regions 257 and depositing the interlayer dielectric material 210 (see FIG. 2h) on the basis of a reduced aspect ratio.

Figure 2L:
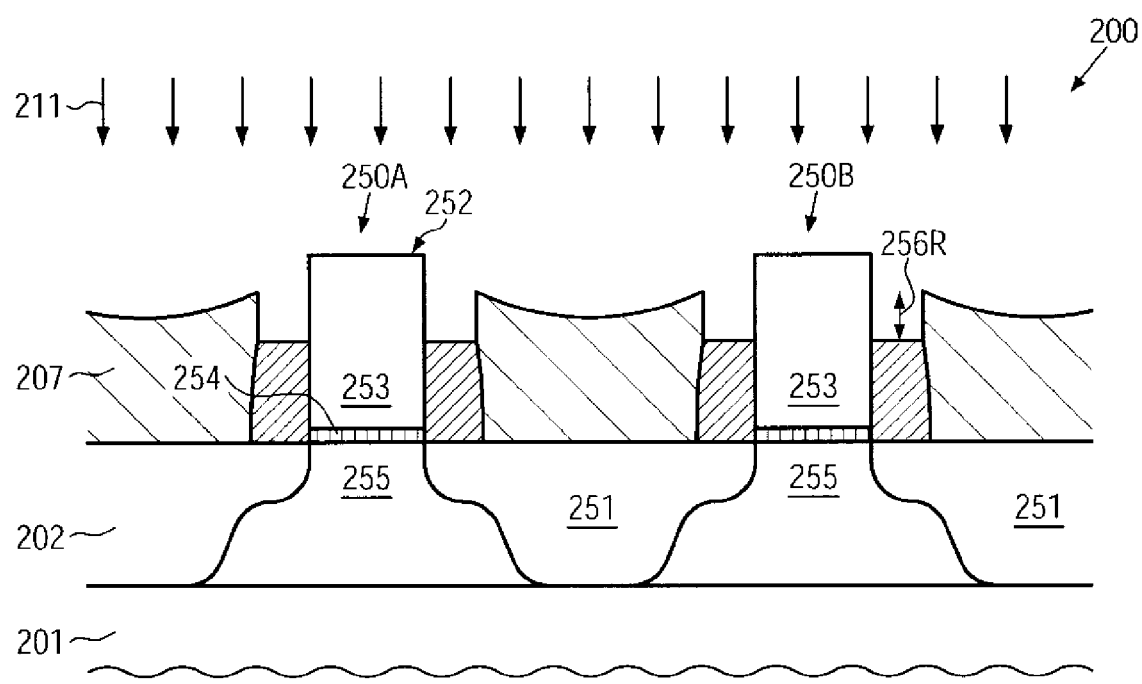
FIG. 2l schematically illustrates a cross-sectional view of the semiconductor device as shown in FIG. 2i wherein an additional etch step may be performed to enhance the controllability of a removal process for reducing the initial electrode height, according to still further illustrative embodiments.

FIG. 2l schematically illustrates the semiconductor device 200 according to other illustrative embodiments in a manufacturing stage wherein the planarization material 207 may be provided and may be used as an etch mask during a selective etch process 211 to selectively remove material from the spacer structures 256, thereby obtaining a reduced height 256R. The etch process 211 may be performed on the basis of any appropriate selective etch recipe, such as wet chemical recipes which are readily available for, for instance, silicon nitride, which may be etched selectively to a silicon material. In this way, the reduced height 256R may be adjusted in a well controllable manner so as to adjust a desired final height of the gate electrode structures 252. That is, in a subsequent removal process, such as the process 208, the reduced spacer structures 256 may act as a CMP stop material to obtain enhanced process uniformity and thus of the resulting gate electrode heights across the substrate 201. For this purpose, a highly selective CMP process may be used wherein the slurry and the polishing parameters may be appropriately selected to obtain an increased removal rate of the polysilicon material of the gate electrode structures 252, while the spacer material may have a significantly reduced polishing rate.

With reference to FIGS. 3a-3g, further illustrative embodiments will now be described, in which the initial gate electrode structure may have incorporated therein an intermediate layer which may be used for enhancing controllability of the removal process as well as the patterning process.

Figure 3A:
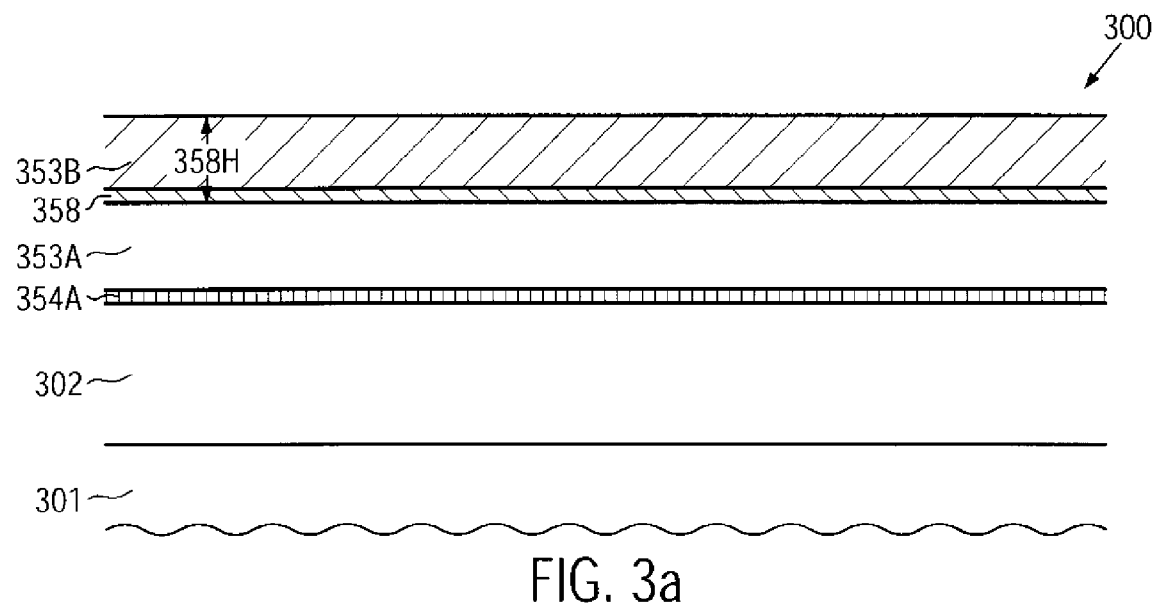
FIGS. 3a-3d schematically illustrate cross-sectional views of a semiconductor device including a gate electrode structure with an intermediate layer for enhancing the removal process prior to the formation of an interlayer dielectric material, according to still further illustrative embodiments.

FIG. 3a schematically illustrates a semiconductor device 300 including a substrate 301 having formed thereabove a semiconductor layer 302. Furthermore, an insulating layer 354A may be formed on the semiconductor layer 302, followed by a gate electrode material 353A. With respect to these components, the same criteria apply as previously explained with reference to the semiconductor device 200. Furthermore, an intermediate material layer 358, which may have a different material composition compared to the electrode material 353A, may be provided with an appropriate thickness, for instance, several nanometers to approximately 10-20 nm, depending on the type of material used. For example, the intermediate layer 358 may be comprised of silicon nitride, silicon dioxide, silicon oxynitride, silicon carbide and the like. Furthermore, an additional implantation blocking layer 353B may be provided, wherein, in one illustrative embodiment, the material 353B may substantially correspond to the material 353A. In this case, a high degree of process compatibility with conventional techniques may be obtained since respective patterning processes may "see" substantially the same material as in conventional gate patterning regimes. In other cases, any other appropriate material may be used for the layer 353B.

The semiconductor device 300 as shown in FIG. 3a may be formed on the basis of well-established techniques, as described above, wherein the intermediate layer 358 may be formed on the basis of oxidation, deposition and the like. For instance, the LPCVD process for forming the layer 353A may be interrupted or the ambient thereof may be changed to form the layer 358 in situ, and thereafter the further deposition of electrode material may be continued to provide the portion 353B. However, other techniques using separate process chambers may also be applied in other cases.

Figure 3B:
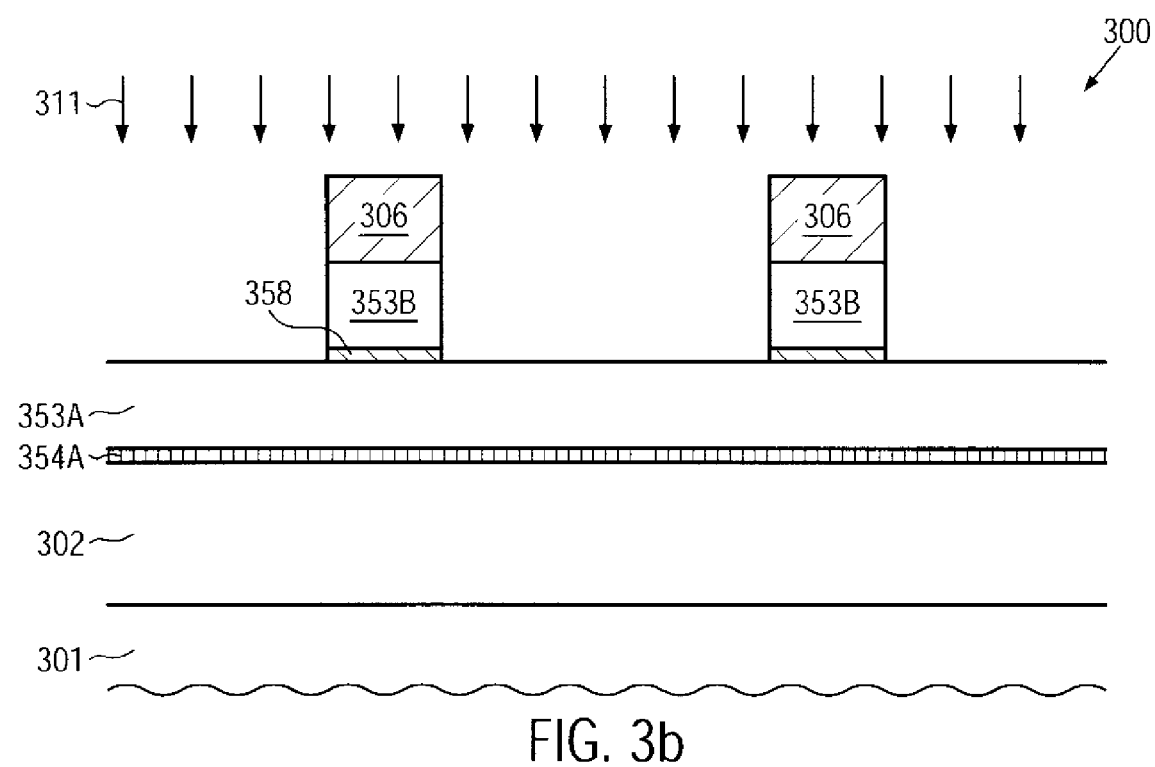

FIG. 3b schematically illustrates the device during a first etch process 311 that is performed on the basis of an etch mask 306, such as a resist mask and the like, in order to etch through the layer 353B, which may be accomplished on the basis of well-established techniques when the material 353B is provided as a polycrystalline silicon material, as discussed above. In this case, the intermediate layer 358 may be used as an efficient etch stop layer, for instance comprised of silicon dioxide, thereby obtaining a high degree of controllability of the process 311. Thereafter, the etch chemistry may be changed to efficiently etch through exposed portions of the intermediate layer 358, for which highly selective etch recipes are available. Thereafter, the etch process 311 may be continued, for instance, after removal of the mask 306 or further using the mask 306, wherein the previously patterned portions 353B may also act as an efficient etch mask.

Figure 3C:
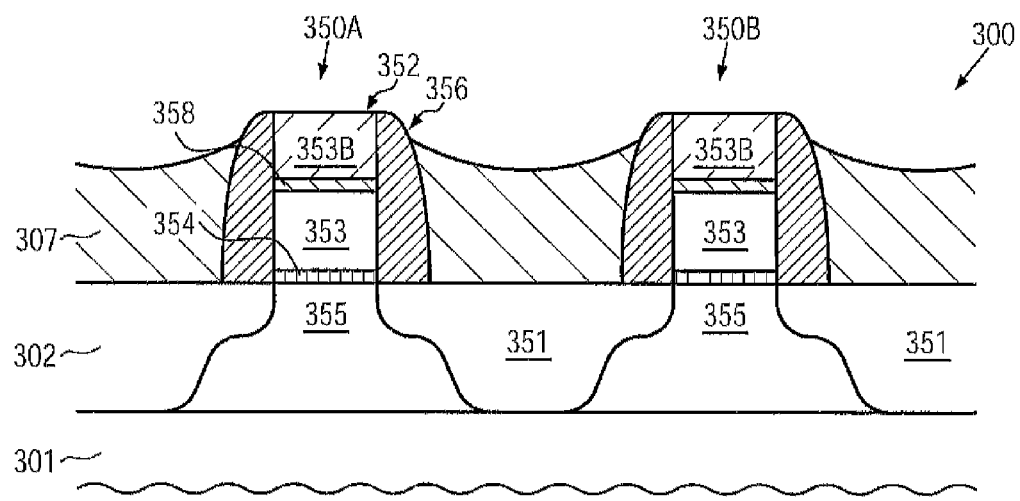

FIG. 3c schematically illustrates the semiconductor device 300 in a further advanced manufacturing stage in which transistors 350A, 350B may be provided including gate electrode structures 352 comprised of the portions 353B, the intermediate layer 358 and an electrode portion 353, which is formed on a gate insulation layer 354. Furthermore, a spacer structure 356 may be formed on sidewalls of the gate electrode structure 352 and drain and source regions 351 may be formed in the semiconductor layer 302. Furthermore, in this manufacturing stage, a planarization material 307 may be provided to substantially fill the spaces between the transistors 350A, 350B, as is also described with reference to the semiconductor device 200. Respective manufacturing processes for forming the transistor 350A, 350B on the basis of the gate electrode structure 352 may include substantially the same process techniques as discussed above.

Figure 3D:
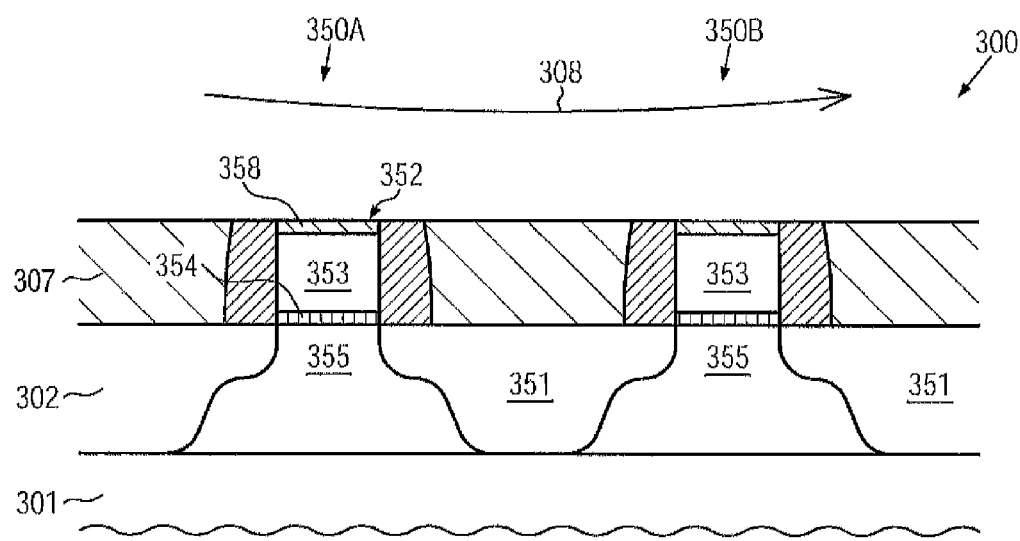

FIG. 3d schematically illustrates the semiconductor device 300 during a removal process 308, which may comprise a CMP process which may be performed as a selective polishing process, in which the intermediate layer 358 may act as an efficient CMP stop layer. Thus, the height level of the gate electrode structure 352 after the removal process 308 may be substantially determined by the vertical position of the intermediate layer 358, which is effectively defined by the deposition sequence as described in FIG. 3a. After the exposure of the intermediate layer 358, the CMP process may be continued for a predefined over-polish time, thereby finally exposing the electrode portions 353. Thereafter, the processing may be continued by removing the planarization material 307 and completing the transistor structures as discussed above. Next, an interlayer dielectric material may be deposited on the basis of a reduced aspect ratio.

Figure 3E:
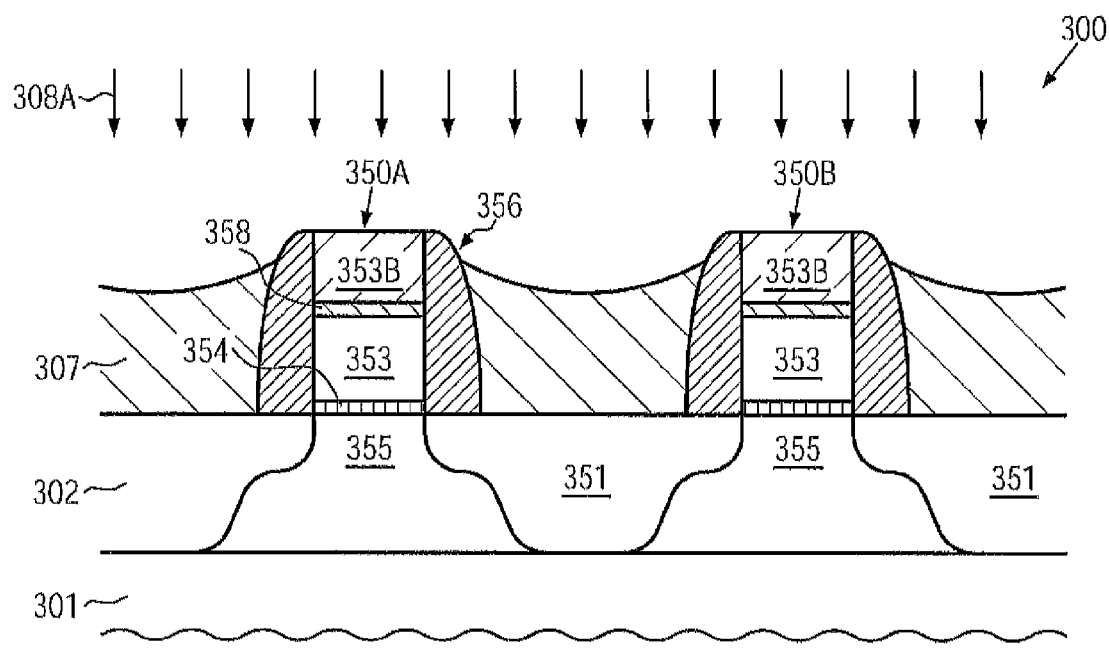
FIG. 3e schematically illustrates a cross-sectional view of the semiconductor device including the intermediate layer, wherein the gate electrode height may be reduced by an etch process, according to a further illustrative embodiment.

FIG. 3e schematically illustrates the semiconductor device 300 according to still further illustrative embodiments in which a removal process 308A may be performed on the basis of an etch ambient to remove material of the portion 353B selectively to the intermediate layer 358, which may then act as an etch stop layer. During the etch process 308A, material of the spacer structures 356 may also be removed, depending on the etch chemistry used. In other cases, the spacer structures 356 may be selectively etched prior to or after the etch process 308A, if the degree of material removal during the etch process 308A may be considered inappropriate. After removing the implantation blocking portion 353B during the etch process 308A, residues of the intermediate layer 358 may be removed on the basis of any appropriate etch recipe and thereafter the further processing may be continued as described above.

Figure 3F:
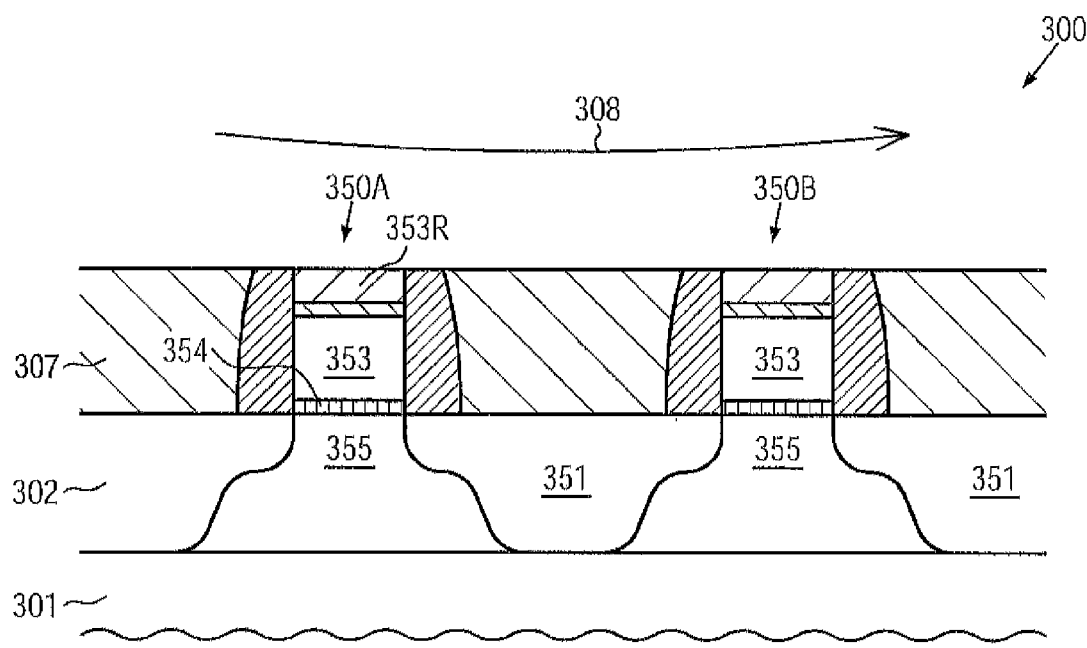
FIGS. 3f-3g schematically illustrate cross-sectional views of the semiconductor device comprising the intermediate layer in the gate electrode structure, wherein the material removal for reducing the electrode height may include a polishing process and an etch process, according to yet other illustrative embodiments.

FIG. 3f schematically illustrates a semiconductor device 300 according to still a further illustrative embodiment in which the removal process 308 may be performed on the basis of a CMP process, during which a substantial part of the portion 353B may be removed on the basis of a time-controlled strategy. Thus, in this case, non-selective CMP techniques may efficiently be used.

Figure 3G:
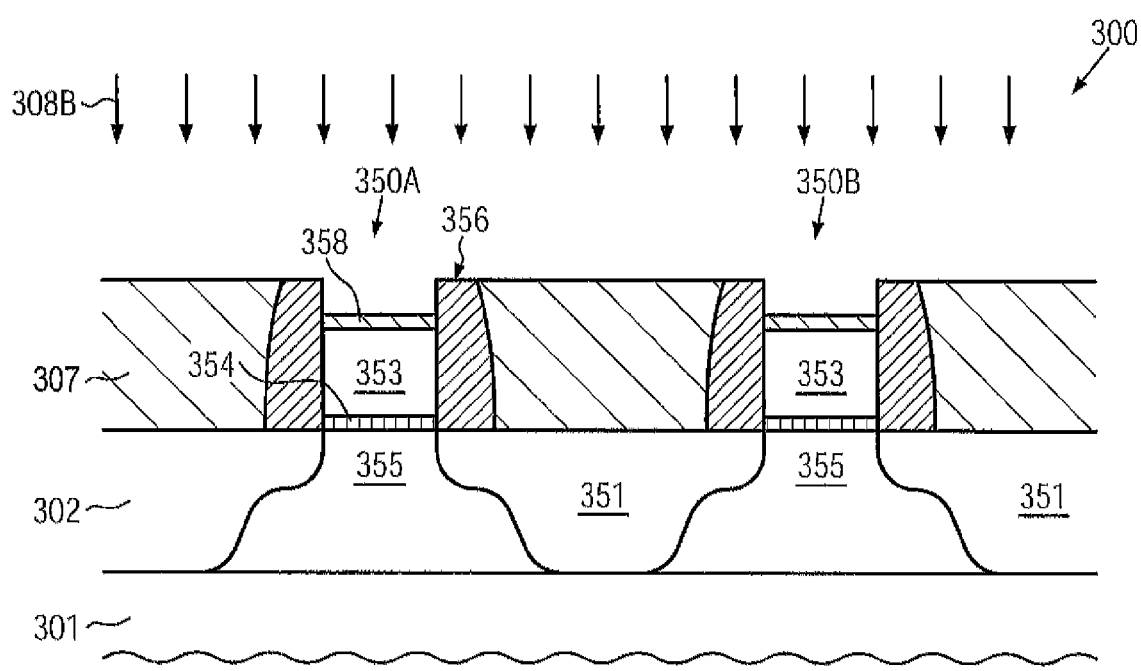

FIG. 3g schematically illustrates the semiconductor device 300 when subjected to a further etch step, in which the residue 353R (FIG. 3f) may be removed in a highly controllable manner on the basis of the intermediate layer 358. Thus, in this case, enhanced process uniformity may be achieved while not requiring sophisticated CMP process techniques. Thereafter, the further processing may be continued as described above and an interlayer dielectric material may be formed on the basis of a reduced aspect ratio. Also, in this case, the sidewall spacers 356 may be reduced, if required, by any appropriate etch recipe and the exposed layer 358 may be removed in a highly controlled manner, as described above.

As a result, the principles disclosed herein provide techniques and semiconductor devices in which the height of gate electrode structures may be reduced after forming the deep drain and source regions on the basis of ion implantation techniques to obtain the desired shielding effect of the gate electrode structures, while providing a reduced aspect ratio in densely packed device regions during the formation of an interlayer dielectric material. Consequently, any desired gate electrode height may be used as a final gate electrode height, which may be less than a maximum vertical extension of the drain and source regions, thereby significantly relaxing the constraints for the deposition processes used for the formation of the interlayer dielectric material, such as highly stressed contact etch stop layers and the like. For this purpose, the gate electrode structures may initially be patterned on the basis of an appropriately thick electrode material in combination with an implantation blocking material, which, in some illustrative embodiments, may be comprised of a different material, while in other illustrative aspects, the gate electrode material may also be used as an efficient implantation blocking species, possibly in combination with an intermediate layer.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed :

1. A method, comprising:
forming a gate electrode structure of a transistor above a semiconductor layer, said gate electrode structure comprising an electrode portion formed on a gate insulation layer and an implantation blocking portion formed on said electrode portion, said implantation blocking portion comprising an upper surface;
forming drain and source regions in said semiconductor layer by ion implantation using said gate electrode structure as an implantation mask to substantially prevent penetration of ions into a channel region of said transistor;
performing a deposition process to form a planarization material adjacent to said gate electrode structure, wherein said deposition process is performed so that said planarization material substantially surrounds said gate electrode structure and wherein an as-deposited upper surface of said planarization material does not cover said upper surface of said implantation blocking portion;
removing at least said implantation blocking portion to expose said electrode portion; and
after removing at least said implantation blocking portion, removing said planarization material and forming an interlayer dielectric material adjacent to and above said electrode portion.

2. The method of claim 1, wherein removing at least said implantation blocking portion comprises performing a polishing process.

3. The method of claim 1, further comprising forming a metal silicide region in said electrode portion.

4. The method of claim 1, wherein forming said gate electrode structure comprises forming a gate insulation layer and an electrode material on said gate insulation layer and forming an implantation blocking material comprising at least one further material layer on said electrode material, said at least one further material layer being comprised of a material differing from said electrode material.

5. The method of claim 4, wherein said at least one further material layer is a top layer of said gate electrode structure.

6. The method of claim 4, wherein said at least one further material layer is an intermediate layer followed by one or more additional layers.

7. The method of claim 6, wherein said one or more additional layers are comprised of material substantially corresponding to said electrode material.

8. The method of claim 5, wherein forming said gate electrode structure comprises patterning said implantation blocking portion by a first etch process and using said patterned implantation blocking portion as an etch mask during a second etch process for patterning said electrode portion.

9. The method of claim 7, wherein forming said gate electrode structure comprises performing a first etch step for etching through said implantation blocking portion while using said intermediate layer as an etch stop layer and performing a second etch step for etching through said electrode portion.

10. The method of claim 1, wherein removing said implantation blocking portion comprises performing an etch process.

11. A method, comprising:
forming a plurality of gate electrode structures above a semiconductor layer, each of said plurality of gate electrode structures having an initial height and an upper surface;
forming drain and source regions in said semiconductor layer by ion implantation using said plurality of gate electrode structures as an implantation mask, said initial height being selected to substantially prevent penetration of ions in said semiconductor layer;
performing a deposition process to form a planarization material above said semiconductor layer, wherein said deposition process is performed so that said planarization material substantially fills gaps between each of said plurality of gate electrode structures and wherein an as-deposited upper surface of said planarization material is positioned below said upper surfaces of said plurality of gate electrode structures;
reducing said initial height of said plurality of gate electrode structures to obtain a reduced height, wherein reducing said height comprises performing a removal process using said planarization material;
after reducing said initial height, removing said planarization material; and
after removing said planarization material, forming an interlayer dielectric material adjacent and above said plurality of gate electrode structures having said reduced height.

12. The method of claim 11, wherein performing said removal process comprises performing a chemical mechanical polishing process.

13. The method of claim 11, wherein performing said removal process comprises performing an etch process.

14. The method of claim 11, wherein forming said plurality of gate electrode structures comprises forming an electrode material on a gate insulation layer and forming at least one material layer on said electrode material, said electrode material and said at least one material layer defining said initial height.

15. The method of claim 14, wherein said at least one material layer is provided as a single material layer.

16. The method of claim 14, wherein forming said at least one material layer comprises forming an intermediate layer and forming at least one blocking layer on said intermediate layer, said intermediate layer and said at least one blocking layer having different material compositions.

17. The method of claim 1, further comprising performing a selective etch process to reduce a height of a spacer structure comprising said gate electrode structure after depositing said planarization material.

18. The method of claim 17, further comprising using said spacer structure of reduced height as a stop material during said removal of said at least said implantation blocking portion.

19. The method of claim 1, wherein performing said deposition process comprises performing a spin-on deposition process to form said planarization material as a substantially non-conformal material layer.

20. The method of claim 19, wherein a height level of an upper surface of said non-conformal material layer is no greater than a height level of said upper surface of said implantation blocking portion.

* * * * *